(12) United States Patent
Hsieh et al.

(10) Patent No.: US 11,621,211 B2
(45) Date of Patent: Apr. 4, 2023

(54) SEMICONDUCTOR PACKAGE STRUCTURE

(71) Applicant: MEDIATEK INC., Hsinchu (TW)

(72) Inventors: Ya-Jui Hsieh, Hsinchu (TW); Chia-Hao Hsu, Hsinchu (TW); Tai-Yu Chen, Hsinchu (TW); Yao-Pang Hsu, Hsinchu (TW)

(73) Assignee: MediaTek Inc., Hsin-Chu (TW)

( * ) Notice: Subject to any disclaimer, the term of this patent is extended or adjusted under 35 U.S.C. 154(b) by 35 days.

(21) Appl. No.: 16/881,206

(22) Filed: May 22, 2020

(65) Prior Publication Data

US 2020/0395267 A1 Dec. 17, 2020

Related U.S. Application Data

(60) Provisional application No. 62/985,371, filed on Mar. 5, 2020, provisional application No. 62/861,379, filed on Jun. 14, 2019.

(51) Int. Cl.
*H01L 23/373* (2006.01)
*H01L 23/367* (2006.01)

(52) U.S. Cl.
CPC ........ *H01L 23/373* (2013.01); *H01L 23/3672* (2013.01)

(58) Field of Classification Search
CPC ............................ H01L 23/373; H01L 23/3672
See application file for complete search history.

(56) References Cited

U.S. PATENT DOCUMENTS

| | | | | |
|---|---|---|---|---|
| 5,909,056 A | * | 6/1999 | Mertol | .................... H01L 23/24 257/704 |
| 6,504,096 B2 | * | 1/2003 | Okubora | ................. H01L 23/66 257/E23.101 |
| 7,015,577 B2 | * | 3/2006 | Wang | .................. H01L 23/3675 257/707 |
| 7,169,650 B2 | * | 1/2007 | Rinella | ................ B22D 17/007 257/E23.109 |
| 7,679,184 B2 | | 3/2010 | Kusano et al. | |
| 8,232,636 B2 | * | 7/2012 | Humenik | ................ H01L 23/42 257/707 |

(Continued)

FOREIGN PATENT DOCUMENTS

| | | |
|---|---|---|
| CN | 109148397 A | 1/2019 |
| DE | 10 2018 216 593 A1 | 4/2020 |

(Continued)

OTHER PUBLICATIONS

European Search Report dated Nov. 3, 2020, issued in application No. EP 20179156.3.

(Continued)

*Primary Examiner* — Eugene Lee
(74) *Attorney, Agent, or Firm* — Wolf, Greenfield & Sacks, P.C.

(57) ABSTRACT

A semiconductor package structure is provided. The semiconductor package structure includes a substrate, a semiconductor die, a molding material, a first bonding layer, and a thermal interface material. The semiconductor die is disposed over the substrate. The molding material surrounds the semiconductor die. The first bonding layer is disposed over the semiconductor die. The thermal interface material is disposed over the molding material.

20 Claims, 5 Drawing Sheets

(56) References Cited

U.S. PATENT DOCUMENTS

| | | | |
|---|---|---|---|
| 2002/0141155 A1* | 10/2002 | Pinneo | H01L 23/3732 |
| | | | 361/688 |
| 2003/0085475 A1* | 5/2003 | Im | H01L 23/16 |
| | | | 257/796 |
| 2003/0183909 A1 | 10/2003 | Chiu | |
| 2005/0041406 A1* | 2/2005 | Matayabas | C09K 5/063 |
| | | | 361/784 |
| 2007/0127211 A1 | 6/2007 | Macris et al. | |
| 2007/0290310 A1 | 12/2007 | Kusano et al. | |
| 2008/0054439 A1 | 3/2008 | Malhan et al. | |
| 2010/0096747 A1 | 4/2010 | Kusano | |
| 2013/0141866 A1* | 6/2013 | Refai-Ahmed | H01L 23/3672 |
| | | | 361/679.54 |
| 2014/0061893 A1* | 3/2014 | Saeidi | H01L 21/52 |
| | | | 257/712 |
| 2015/0155221 A1 | 6/2015 | Chen et al. | |
| 2015/0170989 A1 | 6/2015 | Dhavaleswarapu et al. | |
| 2016/0233145 A1* | 8/2016 | Caroff | H01L 23/4275 |
| 2017/0103937 A1 | 4/2017 | Hsieh et al. | |
| 2017/0170030 A1* | 6/2017 | Iruvanti | H01L 23/3675 |
| 2018/0042139 A1* | 2/2018 | Rosales | H01L 23/3735 |
| 2018/0374714 A1 | 12/2018 | Stathakis et al. | |
| 2019/0006263 A1* | 1/2019 | Yu | H01L 21/4871 |
| 2019/0067152 A1* | 2/2019 | Wuu | H01L 25/0657 |
| 2019/0198422 A1 | 6/2019 | Lin et al. | |
| 2019/0393121 A1 | 12/2019 | Swaminathan et al. | |
| 2020/0161275 A1 | 5/2020 | Lin et al. | |

FOREIGN PATENT DOCUMENTS

| | | |
|---|---|---|
| EP | 0 871 352 A1 | 10/1998 |
| EP | 2 533 275 A1 | 12/2012 |
| TW | 200814255 A | 3/2008 |
| TW | 200816423 A | 4/2008 |
| TW | 201820468 A | 6/2018 |

OTHER PUBLICATIONS

Chinese language office action dated Nov. 11, 2020, issued in application No. TW 109118412.
European Search Report dated Dec. 4, 2020, issued in application No. EP 20179156.3.
Solder Bond vs Epoxy Bond as Thermal Interface Materials (TMI); S-Bond Technologies Blog; Sep. 2018; pp. 1-3.
Brunschwiler, T., et al.; "Embedded Power Insert Enabling Dual-Side Cooling of Microprocessors;" Electronic Components and Technology Conference; May 2015; pp. 833-838.

* cited by examiner

SEMICONDUCTOR PACKAGE STRUCTURE

CROSS REFERENCE TO RELATED APPLICATIONS

This application claims the benefit of U.S. Provisional Application No. 62/861,379, filed on Jun. 14, 2019, and U.S. Provisional Application No. 62/985,371, filed on Mar. 5, 2020, the entirety of which are incorporated by reference herein.

BACKGROUND OF THE INVENTION

Field of the Invention

The present invention relates to a semiconductor package structure, and in particular to a semiconductor package structure having a thermal interface material.

Description of the Related Art

A semiconductor package structure can not only provide a semiconductor die with protection from environmental contaminants, but it can also provide an electrical connection between the semiconductor die packaged therein and a substrate, such as a printed circuit board (PCB).

Heat is generated during the operation of the semiconductor die. If the heat is not adequately removed, the increased temperatures may result in damage to the semiconductor components, and may cause thermal stress and warpage of the semiconductor package structure.

A heat dissipation device is needed to be disposed in the semiconductor package structure. A heatsink is commonly used to transfer the heat away. A thermal interface material is interposed between the semiconductor die and the heatsink to facilitate heat transfer from the semiconductor die to the heatsink. However, while existing heat dissipation devices in the semiconductor package structure generally meet requirements, they are not satisfactory in every respect, and further improvements are needed to improve the heat-dissipation efficiency.

BRIEF SUMMARY OF THE INVENTION

Semiconductor package structures are provided. An exemplary embodiment of a semiconductor package structure includes a substrate, a semiconductor die, a molding material, a first bonding layer, and a thermal interface material. The semiconductor die is disposed over the substrate. The molding material surrounds the semiconductor die. The first bonding layer is disposed over the semiconductor die. The thermal interface material is disposed over the molding material.

Another exemplary embodiment of a semiconductor package structure includes a substrate, a semiconductor die, a molding material, a metal layer, a bonding layer, and a thermal interface material. The semiconductor die is disposed over the substrate. The molding material surrounds the semiconductor die. The metal layer is disposed over the semiconductor die. The bonding layer is disposed over the metal layer. The thermal interface material is disposed over the molding material.

Yet another exemplary embodiment of a semiconductor package structure includes a substrate, a semiconductor die, a bonding layer, a molding material, and a thermal interface material. The semiconductor die is disposed over the substrate. The bonding layer is disposed over the semiconductor die. The molding material surrounds the semiconductor die. The thermal interface material is disposed over the molding material and partially surrounds the bonding layer, wherein the thermal interface material and the bonding layer are spaced apart by a gap.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 2:
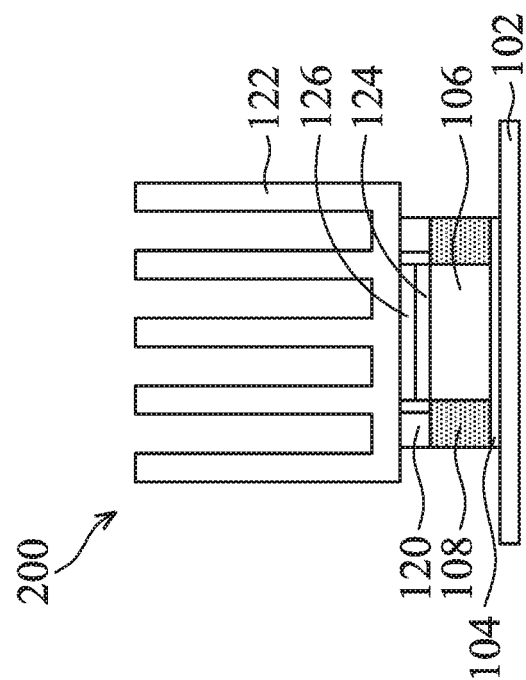
FIG. 2 is a cross-sectional view of a semiconductor package structure, in accordance with some other embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention is described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

Figure 1:
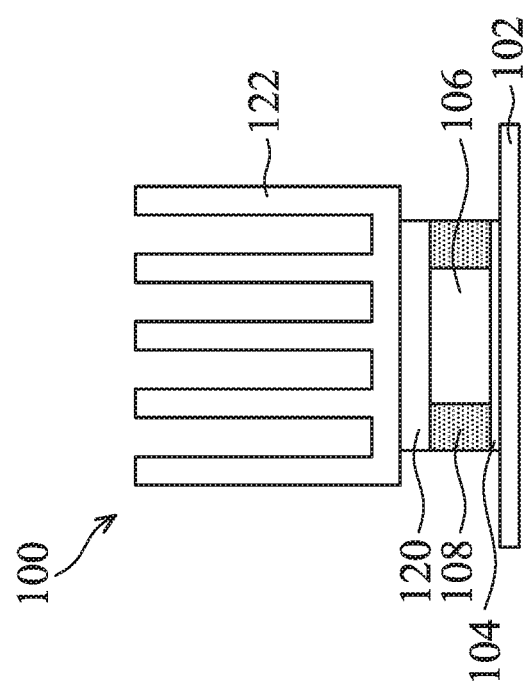
FIG. 1 is a cross-sectional view of a semiconductor package structure, in accordance with some embodiments of the disclosure.

FIG. 1 is a cross-sectional view of a semiconductor package structure 100, in accordance with some embodiments of the disclosure. Additional features can be added to the semiconductor package structure 100. Some of the features described below can be replaced or eliminated for different embodiments. To simplify the diagram, only a portion of the semiconductor package structure 100 is depicted in FIG. 1.

As illustrated in FIG. 1, a substrate 102 is provided, in accordance with some embodiments. The substrate 102 may be a coreless/core substrate or a printed circuit board (PCB). The substrate 102 may be formed of polypropylene (PP), Polyimide, BT/Epoxy, Prepreg, ABF, ceramic material or other suitable material. Any desired semiconductor element may be formed in and on the substrate 102. However, in order to simplify the Figures, only the flat substrate 102 is illustrated.

The semiconductor package structure 100 may include a semiconductor die 106 disposed over the substrate 102. For the sake of simplicity, FIG. 1 only shows one semiconductor die 106, in accordance with some embodiments. In some embodiments, multiple semiconductor dies 106 could be disposed over the substrate 102 and arranged side-by-side. In some embodiments, the semiconductor die 106 is an active device. For example, the semiconductor die 106 is a system-on-chip (SOC) die that may include a microcontroller (MCU), a microprocessor (MPU), a power management integrated circuit (PMIC), a global positioning system (GPS) device, or a radio frequency (RF) device, the like, or any combination thereof. Alternatively, the semiconductor die 106 may be logic dies that may include a central processing unit (CPU), a graphics processing unit (GPU), a dynamic random access memory (DRAM) controller, the like, or any combination thereof. In some other embodiments, one or more passive devices are also bonded onto the substrate 102, such as resistors, capacitors, inductors, the like, or a combination thereof.

The semiconductor package structure 100 includes a molding material 108 surrounding the semiconductor die 106, in accordance with some embodiments. The molding material 108 may adjoin the sidewalls of the semiconductor die 106. Although the upper surface of the semiconductor die 106 is exposed as illustrated, the upper surface of the semiconductor die 106 may also be covered by the molding material 108.

In some embodiments, the molding material 108 includes a nonconductive material such as an epoxy, a resin, a moldable polymer, or another suitable molding material. In some embodiments, the molding material 108 is applied as a substantial liquid, and then is cured through a chemical reaction. In some other embodiments, the molding material 108 is an ultraviolet (UV) or thermally cured polymer applied as a gel or malleable solid, and then is cured through a UV or thermal curing process. The molding material 108 may be cured with a mold (not illustrated).

As illustrated in FIG. 1, the semiconductor die 106 and the molding material 108 are bonded onto the substrate 102 through a conductive element 104, in accordance with some embodiments. In some embodiments, the conductive element 104 includes conductive ball structures, conductive pillar structures, or conductive paste structures that are mounted on and electrically coupled to the substrate 102 in the bonding process. For example, the conductive element 104 may be land grid array (LGA), ball grid array (BGA), the like, or a combination thereof.

As illustrated in FIG. 1, the semiconductor package structure 100 includes a heatsink 122 bonded onto the semiconductor die 106 through a thermal interface material 120, in accordance with some embodiments. The heatsink 122 may be made of Cu, Al, the like, or a combination thereof. The thermal interface material 120 may include a polymer which is adhesive. For example, the thermal interface material 120 may be silicone adhesive, such as SE4450 epoxy from Dow-Corning. In other example, the thermal interface material 120 may also include ceramic material, such as crystalline oxide, nitride or carbide material.

However, side effects may occur when only using the thermal interface material 120 to connect the heatsink 122 and the semiconductor die 106, in some embodiments. Typically, the thermal interface material 120 with high viscosity has low thermal conductivity. Therefore, the thermal interface material 120 may be the thermal bottleneck between the semiconductor die 106 and the heatsink 122. Therefore, the present disclosure provides another embodiment to solve the above problem.

FIG. 2 is a cross-sectional view of a semiconductor package structure 200, in accordance with some other embodiments of the disclosure. It should be noted that the semiconductor package structure 200 may include the same or similar components as that of the semiconductor package structure 100, which is illustrated in FIG. 1, and for the sake of simplicity, those components will not be discussed in detail again. In comparison with the embodiment of FIG. 1 where the heatsink 122 and the semiconductor die 106 are bonded only through the thermal interface material 120, the following embodiments will replace a portion of the thermal interface material 120 with a bonding layer to improve the heat-dissipation efficiency.

Additional features can be added to the semiconductor package structure 200. Some of the features described below can be replaced or eliminated for different embodiments. To simplify the diagram, only a portion of the semiconductor package structure 200 is depicted in FIG. 2.

As illustrated in FIG. 2, a metal layer 124 is disposed on the semiconductor die 106 to provide a surface for the bonding layer to form thereon, in accordance with some embodiments. The metal layer 124 may be formed on the semiconductor die 106 through a backside metallization (BSM) technology. In some embodiments, the metal layer 124 is formed by chemical vapor deposition, sputter deposition, plating, the like, or a combination thereof. The metal layer 124 may include gold, silver, chromium, titanium, tungsten, vanadium, nickel, the like, an alloy thereof, or a combination thereof. The metal layer 124 may also include Stainless Steel (SUS) material. The metal layer 124 may be a single layer or multiple layers.

Although the semiconductor die 106 is coplanar with the molding material 108 as illustrated, the present disclosure is not limit thereto. For example, in some embodiments, the molding material 108 is formed after the formation of the metal layer 124, and the molding material 108 also surrounds the metal layer 124. In these embodiments, the molding material 108 is coplanar with the metal layer 124.

As illustrated in FIG. 2, a bonding layer 126 is disposed on the metal layer 124, in accordance with some embodiments. The bonding layer 126 may include a metal or solder material. For example, the bonding layer 126 may be lead, tin, indium, silver, copper, the like, an alloy thereof, or a combination thereof. Since the bonding layer 126 has better thermal conductivity than the thermal interface material 120, such as 10 times thermal conductivity than the thermal interface material 120, the heat-dissipation efficiency can be improved by disposing the bonding layer 126.

However, if only the bonding layer 126 is used to bond the heatsink 122 to the semiconductor die 106, the stress may be high. In this case, the bonding layer 126 may fragile during the sequential process, such as surface mount technology (SMT), thereby causing yield loss. Therefore, the semiconductor package structure 200 according to the present disclosure includes both of the thermal interface material 120 and the bonding layer 126, thereby improving the heat-dissipation efficiency without increasing stress, which is preferred for high-power applications. As a result, thermal performance, manufacturability and the reliability can be enhanced at the same time.

As illustrated in FIG. 2, the heatsink 122 is connected to the molding material 108 through the thermal interface material 120, and connected to the semiconductor die 106 through the metal layer 124 and the bonding layer 126, in accordance with some embodiments. The thermal interface material 120 may be disposed on the edge of the molding layer 108. In particular, the sidewall of the thermal interface material 120 may be aligned with the sidewall of the molding layer 108.

In some embodiments, the thermal interface material 120 is spaced apart from the metal layer 124 and the bonding layer 126 by a gap to prevent the issues caused by the different coefficients of thermal expansion (CTE) of the thermal interface material 120 and the metal layer 124 and the bonding layer 126. As a result, the reliability of the semiconductor package structure can be improved.

In some embodiments, the thermal interface material 120 is thicker than the metal layer 124 and is thicker than the bonding layer 126 to provide a planar surface for bonding the heatsink 122 thereon. Alternatively, as described above, in some other embodiments, the molding material 108 is coplanar with the metal layer 124. In these embodiments, the thickness of the thermal interface material 120 may be substantially equal to the thickness of the bonding layer 126 to provide a planar surface for bonding the heatsink 122 thereon.

Figure 3B:
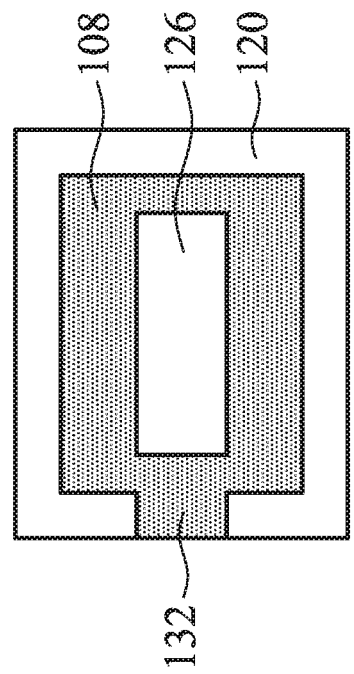
FIGS. 3A-3B are plan views of a semiconductor package structure, in accordance with some embodiments of the disclosure.
Figure 3A:
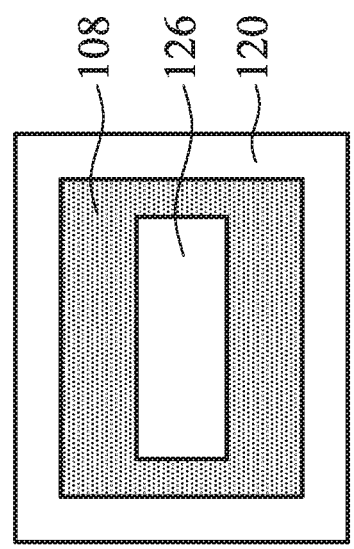

FIGS. 3A-3B are plan views of a semiconductor package structure, in accordance with some embodiments of the disclosure. It should be noted that FIGS. 3A-3B may be the plan view from the top of the semiconductor package structure 200, which is illustrated in FIG. 2, and some components are omitted for brevity.

As illustrated in FIG. 3A, the thermal interface material 120 surrounds the bonding layer 126, in accordance with some embodiments. Although not illustrated, the thermal interface material 120 may also surrounds the metal layer 124 (referring to FIG. 2) disposed below the bonding layer 126. The thermal interface material 120 may be disposed on the edge of the molding layer 108. In particular, the sidewall of the thermal interface material 120 may be aligned with the sidewall of the molding layer 108.

In some embodiments, the thermal interface material 120 is spaced apart from the metal layer 124 and the bonding layer 126 by a gap to prevent the issues caused by the different coefficients of thermal expansion (CTE) of the thermal interface material 120 and the metal layer 124 and the bonding layer 126. As a result, the reliability of the semiconductor package structure can be improved.

As illustrated in FIG. 3B, the thermal interface material 120 partially surrounds the bonding layer 126, in accordance with some embodiments. Although not illustrated, the thermal interface material 120 may also partially surrounds the metal layer 124 disposed below the bonding layer 126. In other words, the thermal interface material 120 is cut off by a gap 132, in some embodiments. The gap 132 may release the gas generated during the manufacturing process. Therefore, the reliability of the semiconductor package structure can be further improved.

Although only one gap 132 is illustrated in FIG. 3B, the present disclosure is not limited thereto. For example, the thermal interface material 120 may be cut off by a plurality of gaps. In particular, the thermal interface material 120 may include a plurality of separate sections.

In some embodiments, instead of being cut off by gaps, the thermal interface material 120 has a notch (not illustrated) to release the gas. In other embodiments, the thermal interface material 120 is cut off by one or more gaps 132 and/or has one or more notches.

Figure 4:
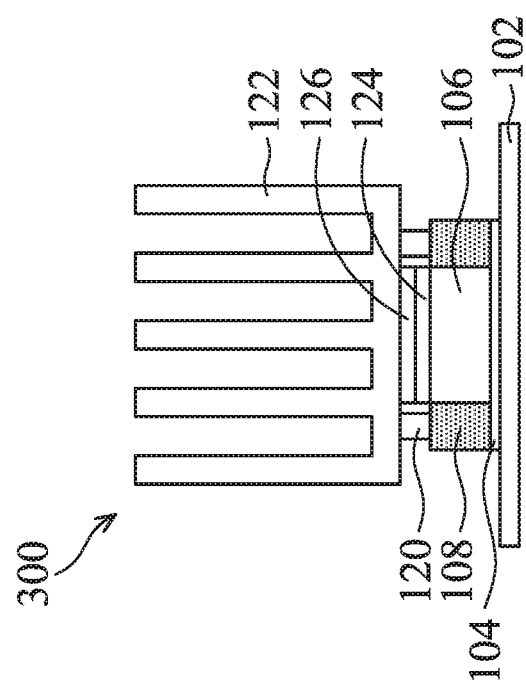
FIG. 4 is a cross-sectional view of a semiconductor package structure, in accordance with some other embodiments of the disclosure.

FIG. 4 is a cross-sectional view of a semiconductor package structure 300, in accordance with some other embodiments of the disclosure. It should be noted that the semiconductor package structure 300 may include the same or similar components as that of the semiconductor package structure 200, which is illustrated in FIG. 2, and for the sake of simplicity, those components will not be discussed in detail again. In comparison with the embodiment of FIG. 2 where the thermal interface material 120 is disposed on the edge of the molding layer 108, the thermal interface material 120 is disposed on the periphery of the molding layer 108. In particular, the sidewalls of the thermal interface material 120 may be inside the sidewalls of the molding layer 108.

Figure 5C:
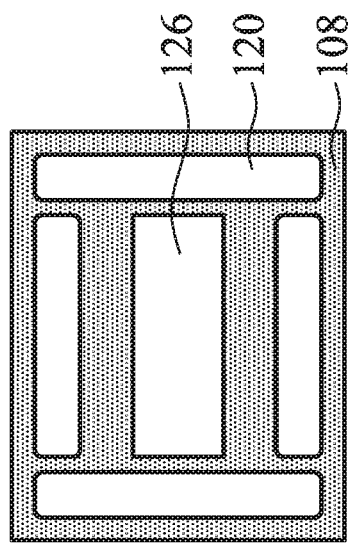
FIGS. 5A-5C are plan views of a semiconductor package structure, in accordance with some embodiments of the disclosure.
Figure 5A:
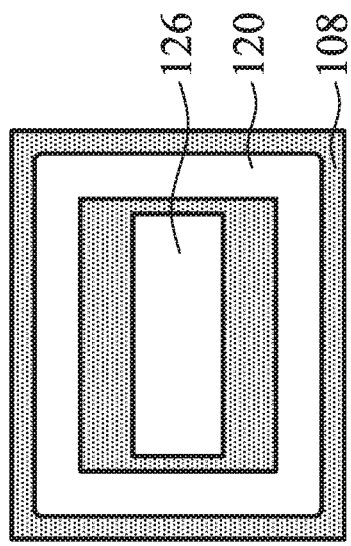
Figure 5B:
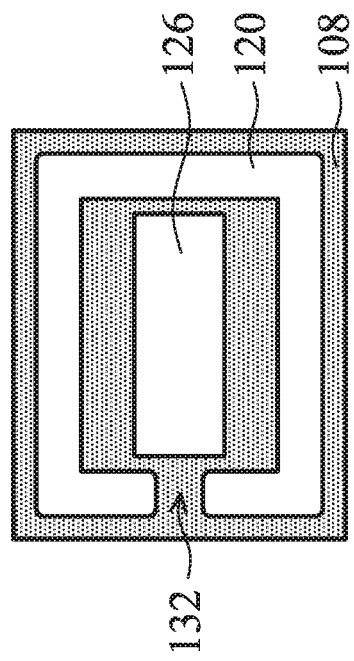

FIGS. 5A-5C are plan views of a semiconductor package structure, in accordance with some embodiments of the disclosure. It should be noted that FIGS. 5A-5C may be the plan view from the top of the semiconductor package structure 300, which is illustrated in FIG. 4, and some components are omitted for brevity.

As illustrated in FIG. 5A, the thermal interface material 120 surrounds the bonding layer 126, in accordance with some embodiments. Although not illustrated, the thermal interface material 120 may also surrounds the metal layer 124 (referring to FIG. 4) disposed below the bonding layer 126. The thermal interface material 120 may be disposed on the periphery of the molding layer 108.

In some embodiments, the thermal interface material 120 is spaced apart from the metal layer 124 and the bonding layer 126 by a gap to prevent the issues caused by the different coefficients of thermal expansion (CTE) of the thermal interface material 120 and the metal layer 124 and the bonding layer 126. As a result, the reliability of the semiconductor package structure can be improved.

As illustrated in FIG. 5B, the thermal interface material 120 partially surrounds the bonding layer 126, in accordance with some embodiments. Although not illustrated, the thermal interface material 120 may also partially surrounds the metal layer 124 disposed below the bonding layer 126. In other words, the thermal interface material 120 is cut off by a gap 132, in some embodiments. The gap 132 may release the gas generated during the manufacturing process. Therefore, the reliability of the semiconductor package structure can be further improved.

Although only one gap 132 is illustrated in FIG. 5B, the present disclosure is not limited thereto. For example, the thermal interface material 120 may be cut off by a plurality of gaps, as illustrated in FIG. 5C. In particular, the thermal interface material 120 may include a plurality of separate sections.

In some embodiments, instead of being cut off by gaps, the thermal interface material 120 has a notch (not illustrated) to release the gas. In other embodiments, the thermal interface material 120 is cut off by one or more gaps 132 and/or has one or more notches.

Figure 6:
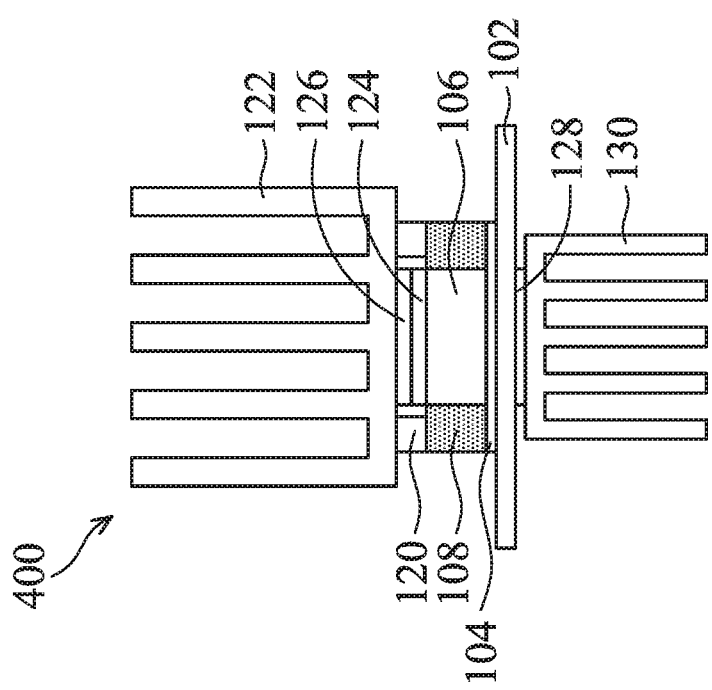
FIG. 6 is a cross-sectional view of a semiconductor package structure, in accordance with some other embodiments of the disclosure.

FIG. 6 is a cross-sectional view of a semiconductor package structure 400, in accordance with some other embodiments of the disclosure. It should be noted that the semiconductor package structure 400 may include the same or similar components as that of the semiconductor package structure 200, and for the sake of simplicity, those components will not be discussed in detail again. In comparison with the embodiment of FIG. 2 where the heatsink 122 is disposed over the substrate 102, the following embodiments further provides another heatsink disposed below the substrate 102 to further improve the heat-dissipation efficiency.

As illustrated in FIG. 6, the semiconductor package structure 400 includes the heatsink 122 and a heatsink 130 disposed on opposite sides of the substrate 102, in accordance with some embodiments. The heatsink 130 may be bonded onto the substrate 102 through a bonding layer 128. The bonding layer 128 may include a metal or solder material. For example, the bonding layer 128 may be lead, tin, indium, silver, copper, the like, an alloy thereof, or a combination thereof. Although only two heatsinks (the heatsink 122 and heatsink 130) are illustrated, the present disclosure may include more than two heatsinks as needed.

In an embodiment, the heatsink 130 is bonded before bonding the heatsink 122. In this embodiment, if the temperature of bonding the heatsink 122 is higher than or substantially equal to the melting point of the bonding layer 128, the bonding layer 128 will melt and cause the heatsink 130 to fall off during the process such as reflow. In this regard, the bonding layer 126 having a melting point lower than the bonding layer 128 can prevent this issue, in accordance with some embodiments. For example, the bonding layer 126 may include SnBi, SnBiAg, the like, or a combination thereof.

Similarly, the composition of the bonding layers may be adjusted based on the process sequence. For example, if the heatsink 122 is bonded before bonding the heatsink 130, the bonding layer 128 used for bonding the heatsink 130 may have a melting point lower than the bonding layer 126 used for bonding the heatsink 122. Therefore, the reliability of the semiconductor package structure 400 can be improved.

In summary, the present disclosure provides a semiconductor package structure including the bonding layer and the thermal interface material, which are used to bond the heatsink onto the substrate, so that the heat-dissipation efficiency can be improved without increasing the stress. Therefore, thermal performance, manufacturability and the reliability of the semiconductor package structure can be enhanced at the same time.

Furthermore, according to some embodiments, the thermal interface material and the bonding layer are spaced apart by a gap to prevent the CTE mismatch. In addition, according to some embodiments, the thermal interface material cut off by one or more gaps and/or the thermal interface material having one or more notches can release the gas generated during the manufacturing process.

Moreover, in some embodiments, the semiconductor package structure has a plurality of heatsinks on opposite sides to further improve the heat-dissipation efficiency. In the embodiment where the heatsink is bonded onto the semiconductor die after the other heatsink is bonded onto the substrate, the bonding layer for the former may has a melting point lower than the bonding layer for latter. Therefore, the risk of the heatsink falling off during the process can be reduced, thereby improving the reliability of the semiconductor package structure.

Many variations and/or modifications can be made to embodiments of the disclosure. The semiconductor package structures in accordance with some embodiments of the disclosure can be used to form a three-dimensional (3D) package, a 2.5D package, a fan-out package, or another suitable package.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package structure, comprising:
   a substrate;
   a semiconductor die disposed over the substrate;
   a molding material surrounding the semiconductor die;
   a first bonding layer disposed over the semiconductor die, wherein the first bonding layer comprises a solder;
   a thermal interface material disposed over the molding material; and
   a metal layer disposed between the first bonding layer and the semiconductor die,
   wherein the metal layer contacts the semiconductor die.

2. The semiconductor package structure as claimed in claim 1, further comprising a heatsink disposed over the first bonding layer.

3. The semiconductor package structure as claimed in claim 2, wherein the thermal interface material connects the molding material and the heatsink.

4. The semiconductor package structure as claimed in claim 1, wherein the thermal interface material is adhesive.

5. The semiconductor package structure as claimed in claim 1, wherein the thermal interface material surrounds the first bonding layer.

6. The semiconductor package structure as claimed in claim 5, wherein the thermal interface material and the first bonding layer are spaced apart by a gap.

7. The semiconductor package structure as claimed in claim 1, wherein the thermal interface material is cut off by a gap.

8. The semiconductor package structure as claimed in claim 1, wherein the thermal interface material is cut off by a plurality of gaps.

9. The semiconductor package structure as claimed in claim 1, further comprising a conductive element disposed between the semiconductor die and the substrate.

10. The semiconductor package structure as claimed in claim 1, further comprising a second heatsink disposed below the substrate, wherein the second heatsink is bonded onto the substrate through a second bonding layer.

11. The semiconductor package structure as claimed in claim 10, wherein the first bonding layer has a melting point lower than the second bonding layer.

12. The semiconductor package structure as claimed in claim 11, wherein the first bonding layer comprises SnBi, SnBiAg, or a combination thereof.

13. A semiconductor package structure, comprising:
    a substrate;
    a semiconductor die disposed over the substrate;
    a molding material surrounding the semiconductor die;
    a metal layer disposed over the semiconductor die;
    a solder layer disposed over the metal layer; and
    a thermal interface material disposed over the molding material,
    wherein the metal layer contacts the semiconductor die.

14. The semiconductor package structure as claimed in claim 13, further comprising a heatsink disposed over the solder layer.

15. The semiconductor package structure as claimed in claim 13, wherein the thermal interface material partially surrounds the metal layer and the solder layer.

16. The semiconductor package structure as claimed in claim 13, wherein the thermal interface material is spaced apart from the metal layer and the solder layer by a gap.

17. The semiconductor package structure as claimed in claim 13, wherein the thermal interface material is thicker than the metal layer and thicker than the solder layer.

18. The semiconductor package structure as claimed in claim 13, wherein a sidewall of the thermal interface material is aligned with a sidewall of the molding material.

19. A semiconductor package structure, comprising:
- a substrate;
- a semiconductor die disposed over the substrate;
- a bonding layer disposed over the semiconductor die;
- a molding material surrounding the semiconductor die; and
- a thermal interface material disposed over the molding material and surrounding the bonding layer on at least three sides of the bonding layer, wherein the thermal interface material and the bonding layer are spaced apart by a gap, and
- a metal layer disposed between the bonding layer and the semiconductor die,
- wherein the bonding layer comprises a solder, and
- wherein the metal layer contacts the semiconductor die.

20. The semiconductor package structure as claimed in claim 19, further comprising a heatsink disposed over the thermal interface material.

\* \* \* \* \*